United States Patent
Kim (10) Patent No.: US 10,333,027 B2
(45) Date of Patent: Jun. 25, 2019

(54) LIGHT-EMITTING DEVICE AND MANUFACTURING METHOD THEREFOR

(71) Applicant: LG INNOTEK CO., LTD., Seoul (KR)

(72) Inventor: Chong Cook Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 11 days.

(21) Appl. No.: 15/576,194

(22) PCT Filed: May 19, 2016

(86) PCT No.: PCT/KR2016/005333
§ 371 (c)(1),
(2) Date: Nov. 21, 2017

(87) PCT Pub. No.: WO2016/190612
PCT Pub. Date: Dec. 1, 2016

(65) Prior Publication Data
US 2018/0138362 A1    May 17, 2018

(30) Foreign Application Priority Data

May 22, 2015   (KR) .......... 10-2015-0071937

(51) Int. Cl.
*H01L 33/14*   (2010.01)
*H01L 33/22*   (2010.01)
*H01L 27/15*   (2006.01)
*H01L 33/06*   (2010.01)

(52) U.S. Cl.
CPC ........... *H01L 33/14* (2013.01); *H01L 27/153* (2013.01); *H01L 33/06* (2013.01); *H01L 33/145* (2013.01); *H01L 33/22* (2013.01)

(58) Field of Classification Search
CPC ....................................... H01L 33/14
USPC ........................................... 257/88
See application file for complete search history.

(56) References Cited

U.S. PATENT DOCUMENTS

| 2012/0187365 A1* | 7/2012 | Jeong ............. H01L 33/10 257/9 |
| 2013/0082273 A1* | 4/2013 | Ting .............. H01L 21/02458 257/76 |
| 2014/0131734 A1* | 5/2014 | Ting .............. H01L 21/02505 257/76 |

(Continued)

FOREIGN PATENT DOCUMENTS

| JP | 2013-120774 A | 6/2013 |
| JP | 2014-518014 A | 7/2014 |

(Continued)

*Primary Examiner* — Igwe U Anya
(74) *Attorney, Agent, or Firm* — Birch, Stewart, Kolasch & Birch, LLP (57) ABSTRACT

Disclosed in one embodiment is a light-emitting device comprising: a first semiconductor layer; an active layer arranged on the first semiconductor layer and including a plurality of first uneven portions; an electron blocking layer including a plurality of second uneven portions arranged on the plurality of first uneven portions; and a second semiconductor layer formed on the electron blocking layer, wherein the electron blocking layer has at least two doping concentration peak sections of a p-type dopant in the thickness direction.

16 Claims, 10 Drawing Sheets

(56) References Cited

U.S. PATENT DOCUMENTS

| | | | |
|---|---|---|---|
| 2014/0225059 A1* | 8/2014 | Yang | H01L 33/145 |
| | | | 257/13 |
| 2014/0332756 A1 | 11/2014 | Kashihara et al. | |
| 2015/0060762 A1 | 3/2015 | Kim et al. | |
| 2016/0087145 A1* | 3/2016 | Kumagai | H01L 33/20 |
| | | | 257/13 |

FOREIGN PATENT DOCUMENTS

| | | |
|---|---|---|
| KR | 10-2014-0101130 A | 8/2014 |
| KR | 10-2015-0017103 A | 2/2015 |
| KR | 10-2015-0025264 A | 3/2015 |
| WO | WO 2013/049415 A2 | 4/2013 |

* cited by examiner

| | Al | thickness |
|---|---|---|
| p-AlGaN | 20% | 2nm |
| Interval | 2 sec | |

× 15

(b)

| | Al | thickness |
|---|---|---|
| p-AlGaN | 20% | 2nm |
| Interval | 5 sec | |

× 15

(c)

| | Al | thickness |
|---|---|---|
| p-AlGaN | 20% | 1nm |
| Interval | 2 sec | |

× 30

(d)

| | Al | thickness |
|---|---|---|
| p-AlGaN | 20% | 1nm |
| Interval | 5 sec | |

| | Al | thickness |
|---|---|---|
| p-AlGaN_1 | 25% | 2nm |
| Interval | 2 sec | |
| p-AlGaN_2 | 10% | 2nm |

× 8

(b)

| | Al | thickness |
|---|---|---|
| p-AlGaN_1 | 25% | 2nm |
| Interval | 2 sec | |
| p-AlGaN_2 | 10% | 2nm |
| Interval | 2 sec | |

× 8

(c)

| | Al | thickness |
|---|---|---|
| p-AlGaN_1 | 25% | 2nm |
| Interval | 5 sec | |
| p-AlGaN_2 | 10% | 2nm |

× 2 } × 8

(d)

| | Al | thickness |
|---|---|---|
| p-AlGaN_1 | 25% | 2nm |
| Interval | 5 sec | |
| p-AlGaN_2 | 10% | 2nm |
| Interval | 5 sec | |

|  | Al | thickness |
|---|---|---|
| p-AlGaN_1 | 25% | 1nm |
| Interval | 2 sec | |
| p-AlGaN_2 | 10% | 2nm |

× 2  × 8

(b)

|  | Al | thickness |
|---|---|---|
| p-AlGaN_1 | 25% | 1nm |
| Interval | 2 sec | |
| p-AlGaN_2 | 10% | 1nm |
| Interval | 2 sec | |

× 2  × 2  × 8

(c)

|  | Al | thickness |
|---|---|---|
| p-AlGaN_1 | 25% | 1nm |
| Interval | 5 sec | |
| p-AlGaN_2 | 10% | 2nm |

× 2  × 8

(d)

|  | Al | thickness |
|---|---|---|
| p-AlGaN_1 | 25% | 1nm |
| Interval | 5 sec | |
| p-AlGaN_2 | 10% | 1nm |
| Interval | 5 sec | |

× 2  × 2  × 8

LIGHT-EMITTING DEVICE AND MANUFACTURING METHOD THEREFOR

CROSS REFERENCE TO RELATED APPLICATIONS

This application is the National Phase of PCT International Application No. PCT/KR2016/005333, filed on May 19, 2016, which claims priority under 35 U.S.C. 119(a) to Patent Application No. 10-2015-0071937, filed in the Republic of Korea on May 22, 2015, all of which are hereby expressly incorporated by reference into the present application.

TECHNICAL FIELD

The present disclosure relates to a light-emitting device and a manufacturing method therefor.

BACKGROUND ART

A light-emitting diode (LED) is one of light-emitting devices that emit light when a current is applied thereto. LEDs may operate at a low voltage to emit light with high efficiency, and thus an energy saving effect thereof is outstanding. Recently, a luminance problem of the LED has been significantly improved, and thus the LED is being applied to various devices such as backlight units of liquid crystal display devices, electronic sign boards, indicators, home appliances, and the like.

LED includes a light-emitting structure having an N-type semiconductor layer, an active layer, and a p-type semiconductor layer which are provided on a support substrate, and includes an N-type electrode and a p-type electrode which are connected to the light-emitting structure.

Owing to lattice inconsistency between the light-emitting structure and the support substrate, however, a lattice defect, such as dislocation, may occur in a first semiconductor layer. A V-shaped pit caused by the dislocation is formed in the active layer such that there is a problem in that luminous efficiency is degraded.

DISCLOSURE

Technical Problem

The present disclosure is directed to providing a light-emitting device with improved carrier implantation efficiency.

In addition, the present disclosure is directed to providing a light-emitting device with improved light-emission efficiency.

Technical Solution

One aspect of the present disclosure provides a light-emitting device including a first semiconductor layer; an active layer disposed on the first semiconductor layer and including a plurality of first uneven portions; an electron blocking layer including a plurality of second uneven portions disposed on the plurality of first uneven portions; and a second semiconductor layer formed on the electron blocking layer, wherein the electron blocking layer may have two or more doping concentration peak sections of a P-type dopant in a thickness direction of the electron blocking layer.

A thickness of each of the plurality of second uneven portions may be formed to be smaller than a thickness of an even region formed between the plurality of second uneven portions.

The electron blocking layer may have two or more peak sections in a thickness direction of the even region.

The electron blocking layer may include a plurality of sub-layers and may have a peak section at an interface formed between the plurality of sub-layers.

Elements configuring the plurality of sub-layers may be the same.

The electron blocking layer may include a first sub-layer closest to the active layer and a second sub-layer formed on the first sub-layer, and the first sub-layer may have two or more peak sections in the thickness direction.

The electron blocking layer may include a first sub-layer closest to the active layer and a second sub-layer formed on the first sub-layer, the first sub-layer may be undoped with the P-type dopant, and the second sub-layer may have two peak sections in the thickness direction.

Another aspect of the present disclosure provides a light-emitting device including a first semiconductor layer; an active layer disposed on the first semiconductor layer and including a plurality of first uneven portions; an electron blocking layer including a plurality of second uneven portions disposed on the plurality of first uneven portions; and a second semiconductor layer formed on the electron blocking layer, wherein the electron blocking layer may include a first carrier implantation path in a region provided between the plurality of second uneven portions, and a second carrier implantation path at a sidewall of each of the second uneven portions.

A thickness of each of the plurality of second uneven portions may be smaller than that of an even region formed between the plurality of second uneven portions.

The electron blocking layer may include a plurality of sub-layers and may include a peak section of the p-type dopant at an interface formed between the plurality of sub-layers.

The interfaces of the plurality of sub-layers may partially overlap at the sidewall of the uneven portion.

Still another aspect of the present disclosure provides a method of manufacturing a light-emitting device, including forming an active layer in which a plurality of first uneven portions are formed; and forming an electron blocking layer having second uneven portions on the active layer in which the plurality of first uneven portions are formed, wherein the forming of the electron blocking layer includes blocking a supply of a raw material for a predetermined period according to a growth interruption period.

The forming of the electron blocking layer may include blocking a supply of a growth material a plurality of times while a nitrogen atmosphere is maintained.

The forming of the electron blocking layer may include growing the second uneven portion to have a thickness that is smaller than that of a region provided between the second uneven portions.

Advantageous Effects

In accordance with the embodiments of the present disclosure, holes can be effectively implanted through a sidewall of a second uneven portion of an electron blocking layer. Therefore, even though a size of the uneven portion is increased, an optical characteristic of a light-emitting device can be improved.

In addition, holes can be directly implanted into a central portion of an active layer, and thus light-emission efficiency can be improved. Therefore, a droop phenomenon in which optical efficiency of a light-emitting device is decreased as a current density is lowered can be alleviated.

Various beneficial advantages and effects of the present disclosure are not limited by the detailed description and should be easily understood through a description of a detailed embodiment of the present disclosure.

MODES OF THE INVENTION

The present disclosure may be variously modified and may have a variety of embodiments, however, specific embodiments thereof will be illustrated in the drawings and a description thereof will be described. The embodiments, however, are not to be taken in the sense of limiting the present disclosure to the specific embodiments and should be construed as including modifications, equivalents, or substitutions within the spirit and technical scope of the present disclosure.

Further, terms including ordinal numbers such as "first," "second," and the like used herein are used to describe various components, but the components are not limited by the terms. The terms are used only for the purpose of distinguishing one component from another component. For example, without departing from the scope of the present disclosure, a first component may be referred to as a second component, and similarly, a second component may also be referred to as a first component. The term "and/or" includes a combination of a plurality of related listed items and any one item of the plurality of related listed items.

The terms used herein are employed to describe only specific embodiments and are not intended to limit the present disclosure. Unless the context clearly dictates otherwise, the singular form includes the plural form. It should be understood that the terms "comprise" and "have" specify the presence of stated herein features, numbers, steps, operations, elements, components, and combinations thereof, but do not preclude the presence or possibility of addition of one or more another features, numbers, steps, operations, elements, components, and combinations thereof.

In the description of the embodiments, when an element is described as being formed "on" or "under" another element, the terms "on" or "under" includes the meaning of the two components bring in direct contact with each other and the meaning of one or more other components being indirectly disposed and formed between the two components. Further, when an element is described as being formed "on" or "under" another element, the description may include the meaning of the other element being "formed in an upward direction of the element" and "formed in a downward direction of the element."

Hereinafter, embodiments of the present disclosure will be described in detail with reference to the accompanying drawings, the same reference numerals will be assigned to the same or corresponding components regardless of reference numerals, and repetitive descriptions thereof will be omitted.

Figure 1:
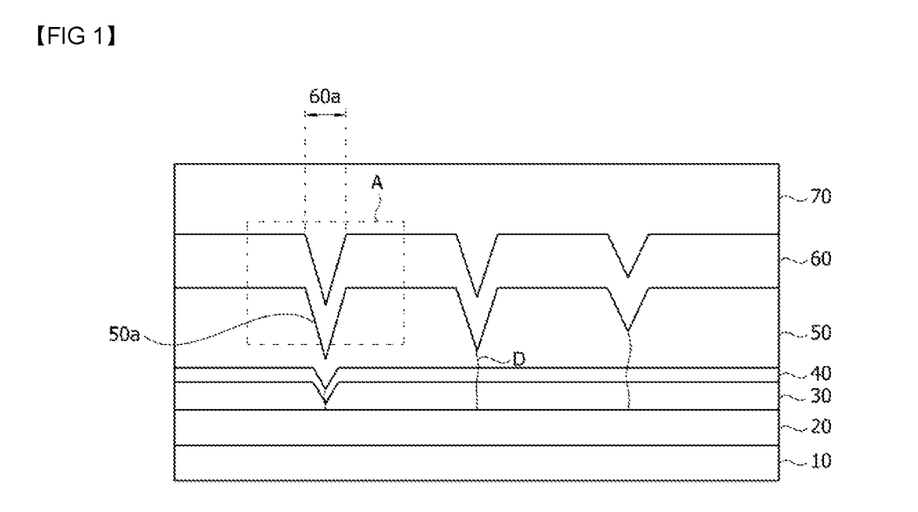
FIG. 1 is a conceptual diagram of a light-emitting device according to one embodiment of the present disclosure.
Figure 2:
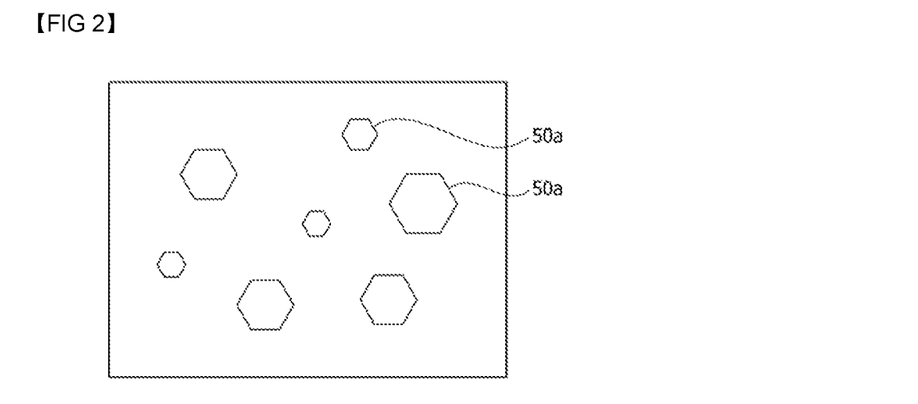
FIG. 2 is a diagram for describing uneven portions of various sizes according to one embodiment of the present disclosure.
Figure 3:
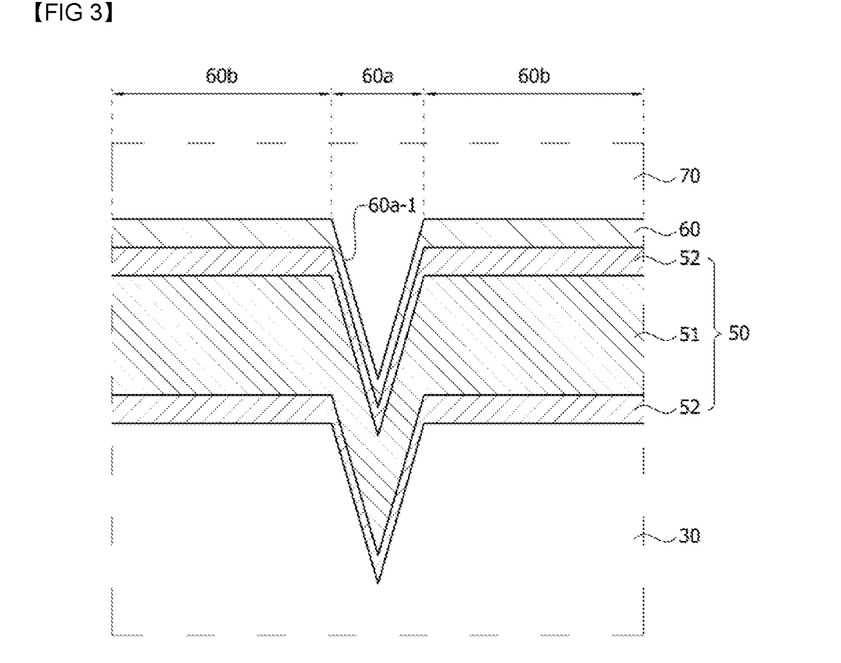
FIG. 3 is an enlarged diagram of portion A in FIG. 1.

FIG. 1 is a conceptual diagram of a light-emitting device according to one embodiment of the present disclosure, FIG. 2 is a diagram for describing uneven portions of various sizes according to one embodiment of the present disclosure, and FIG. 3 is an enlarged diagram of portion A in FIG. 1.

Referring to FIG. 1, the light-emitting device according to one embodiment of the present disclosure includes a first semiconductor layer 30 disposed on a support substrate 10, an active layer 50 disposed on the first semiconductor layer 30 and including a plurality of first uneven portions 50a, an electron blocking layer (EBL) 60 including a plurality of second uneven portions 60a disposed on the plurality of first uneven portions 50a, and a second semiconductor layer 70 formed on the EBL 60.

The support substrate 10 includes a conductive substrate or an insulating substrate. The support substrate 10 may be a material suitable for semiconductor material growth or may be a carrier wafer. The support substrate 10 may be formed of a material selected from among sapphire ($Al_2O_3$), SiC, GaAs, GaN, ZnO, Si, GaP, InP, and Ge, but is not limited thereto.

A buffer layer 20 may be further provided between the first semiconductor layer 30 and the support substrate 10. The buffer layer 20 may alleviate lattice non-conformity between the support substrate 10 and a light-emitting structure provided thereon.

The buffer layer 20 may include a combination of Group III and Group V elements, or may include any one of GaN, InN, AlN, InGaN, AlGaN, InAlGaN, and AlInN. The buffer layer 20 may be doped with a dopant, but is not limited thereto.

The buffer layer 20 may be grown as a single crystal on the support substrate 10, and the buffer layer 20 grown as the single crystal may improve crystallizability of the first semiconductor layer 30 which is grown on the buffer layer 20.

The light-emitting structure provided on the support substrate 10 includes the first semiconductor layer 30, the active layer 50, and the second semiconductor layer 70. Generally, the above-described light-emitting structure may be divided into a plurality of structures by cutting the support substrate 10.

The first semiconductor layer 30 may be formed of a Group III-V or II-VI compound semiconductor, and the first semiconductor layer 30 may be doped with a first dopant. For example, the first semiconductor layer 30 is selected from among GaN, AlGaN, InGaN, InAlGaN, and the like which are semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$). Further, the first dopant may be an n-type dopant such as Si, Ge, Sn, Se, or Te. When the first dopant is the n-type dopant, the first semiconductor layer 30 doped with the first dopant may be an n-type semiconductor layer.

The active layer 50 is a layer in which electrons (or holes) implanted through the first semiconductor layer 30 and holes (or electrons) implanted through the second semiconductor layer 70 are recombined. The active layer 50 may transition to being a low energy level due to the recombination of electrons and holes and emit light having a wavelength corresponding to the transition.

The active layer 50 may have any one of a single well structure, a multi-well structure, a single quantum well structure, a multi quantum well (MQW) structure, a quantum dot structure, or a quantum wire structure, but the active layer 50 is not limited thereto.

Generally, a lattice defect such as a plurality of dislocations D may occur in the first semiconductor layer 30 due to lattice non-conformity between the support substrate 10 and the first semiconductor layer 30. Further, a leakage current may be increased and the light-emitting device may become vulnerable to external static electricity due to such a dislocation D.

The first uneven portion 50a having a V shape formed by the dislocation D may be formed in the active layer 50. The first uneven portion 50a may alleviate strain between the first semiconductor layer 30 and the active layer 50, and may prevent extension of the dislocation D to the active layer 50 and the second semiconductor layer 70 to improve quality of the light-emitting device.

The first uneven portion 50a may prevent a leakage current resulting from the dislocation D to improve an electrostatic discharge (ESD) yield. However, a region at which the first uneven portion 50a is formed may not contribute to an emission of light, and thus there is a problem in that an intensity of light is deteriorated. Referring to FIG. 2, a size of the first uneven portion 50a may be variously formed.

The second semiconductor layer 70 may be formed on the active layer 50, may be implemented with a Group III-V or II-VI compound semiconductor, and may be doped with a second dopant. The second semiconductor layer 70 may be formed of a semiconductor material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, Ba, or the like, the second semiconductor layer 70 doped with the second dopant may be a p-type semiconductor layer.

The EBL 60 is disposed between the active layer 50 and the second semiconductor layer 70. The EBL 60 may block a flow of electrons which are supplied from the first semiconductor layer 30 and are discharged to the second semiconductor layer 70, thereby increasing the probability of the electrons recombining with holes in the active layer 50. An energy band gap of the EBL 60 may be greater than that of the active layer 50 and/or the second semiconductor layer 70.

For example, the EBL 60 may be selected from among AlGaN, InGaN, InAlGaN, and the like which are semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$).

The EBL 60 is formed on the active layer 50 including the first uneven portion 50a so that the EBL 60 includes the second uneven portion 60a corresponding to a shape of the first uneven portion 50a.

Referring to FIG. 3, the EBL 60 includes a plurality of second uneven portions 60a and regions provided between the plurality of second uneven portions 60a (hereinafter, referred to as even regions). An even region 60b may be a relatively flat region in comparison to the second uneven portion 60a. The even region 60b may be defined as a region grown from a (0001) crystal face, and a sidewall 60a-1 of the second uneven portion may be defined as a region grown from a (1-101) crystal face.

The EBL 60 may be doped with a p-type dopant to enhance hole implantation. When the EBL 60 is doped with the p-type dopant, resistance is lowered such that current injection may be increased. The p-type dopant may be one or more selected from the group consisting of Mg, Zn, Ca, Sr, and Ba.

In the even region 60b, a concentration of the p-type dopant is high, and thus hole implantation is relatively easy, whereas, in the second uneven portion 60b, a concentration of Al is relatively high and a concentration of the p-type dopant is low, and thus there is a problem in that hole implantation is difficult. That is, resistance of the second uneven portion 60b may be greater than that of the even region 60b. Doping of the p-type dopant becomes more difficult as a thickness of the second uneven portion 60b decreases.

Figure 4:
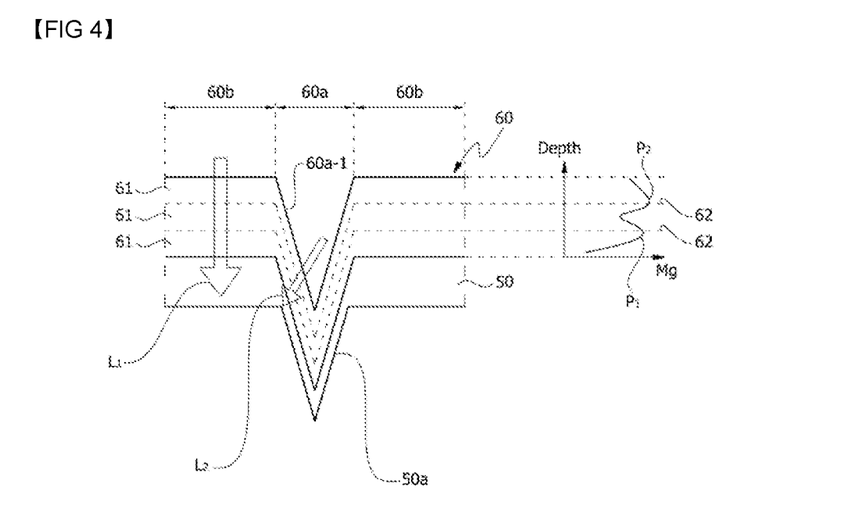
FIG. 4 is a diagram for describing a feature of an electron blocking layer according to one embodiment of the present disclosure.
Figure 5:
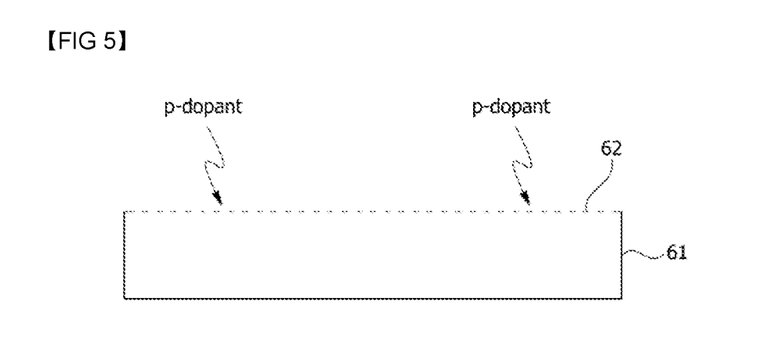
FIG. 5 is a diagram for describing a process of bonding a p-type dopant to an interface between sub-layers of the electron blocking layer.
Figure 6:
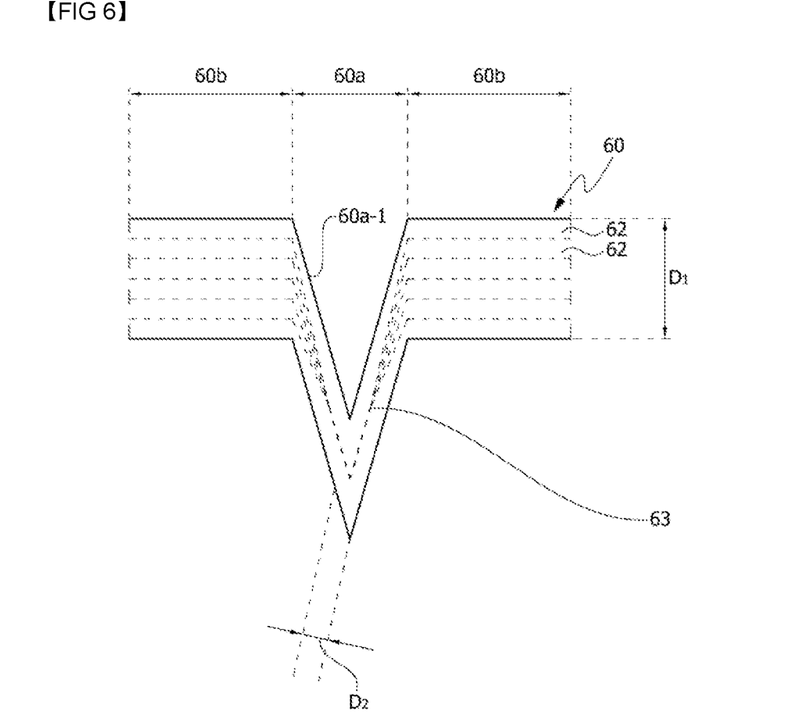
FIG. 6 is a diagram illustrating a modified embodiment of FIG. 4.

FIG. 4 is a diagram for describing a feature of the EBL according to one embodiment of the present disclosure, FIG. 5 is a diagram for describing a process of bonding a p-type dopant to an interface between sub-layers of the EBL, and FIG. 6 is a diagram illustrating a modified embodiment of FIG. 4.

Referring to FIG. 4, the EBL 60 may include a plurality of sub-layers 61 and may have a concentration peak section (hereinafter, referred to as a peak section) of the p-type dopant at interfaces 62 provided between the plurality of sub-layers 61. All of the plurality of sub-layers 61 may contain the same element. As one example, all of the sub-layers 61 may be Mg-doped AlGaN. Therefore, the EBL 60 may have a substantially uniform energy band gap in a thickness direction thereof.

The peak section may be defined as an inflection point at which a concentration of the p-type dopant increases and then decreases. The interface 62 may be an imaginary line connecting the peak sections. The sub-layer 61 may be a layer having a physical boundary, but is not limited thereto, and the sub-layer 61 may be a virtual layer defined in upward and downward directions based on the peak section.

Since the plurality of sub-layers 61 have a plurality of peak sections at the interfaces 62, a doping concentration of the EBL 60 may be relatively high. In FIG. 4, two peak sections P1 and P2 are illustrated in the thickness direction of the EBL 60, but the number of peak sections is not limited thereto.

In the second uneven portion 60b of the EBL 60, the concentration of the p-type dopant also increases, and thus holes may be effectively implanted. Accordingly, in the EBL

60, a first carrier implantation path L1 may be formed at the even region 60*b* and a second carrier implantation path L2 may be formed at the sidewall 60*a*-1 of the second uneven portion. Since the second carrier implantation path L2 is significantly thinner than the first carrier implantation path L1, implantation efficiency of the second carrier implantation path L2 may be enhanced.

The holes may be effectively implanted into a lower even region of the active layer 50 through the relatively thin second carrier implantation path 50*a*. Consequently, since a relatively large number of well layers participate in the emission of light, light-emission efficiency may be enhanced.

Therefore, even when a size of the first uneven portion 50*a* is enlarged to increase an ESD yield, holes that are implanted therein are increased at a lower well layer through the second uneven portion sidewall 60*a*-1 such that deterioration in an intensity of light may not substantially occur.

According to the present embodiment, an increase in the intensity of light, a reduction in a droop phenomenon, and an enhancement of the ESD may be simultaneously achieved by the EBL 60.

The peak section may be formed at the interface 62 of the sub-layer 61 by applying an interruption period when each of the sub-layers 61 is formed.

Referring to FIG. 5, during the interruption period, the p-type dopant that is dispersed around the sub-layer 61 may be bonded to a surface (i.e., an interface) of the sub-layer 61 of which growth is stopped.

That is, the interruption period may provide a time required for the p-type dopant to be bonded to the surface (that is, the interface) of the sub-layer 61. Consequently, a plurality of peak sections may be formed in the thickness direction of the EBL 60 by providing the interruption period a plurality of times such that the concentration of the dopant may be increased.

When the interruption period is too long, however, a problem in that the p-type dopant bonded to the surface of the sub-layer 61 may be revolatilized may occur. Consequently, the interruption period is preferably controlled to be relatively short to prevent volatilization of the p-type dopant. When the interruption period (e.g., an interval) is controlled to be in a range of about 1 second to 10 seconds, the p-type dopant bonded to the surface may be effectively confined between the sub-layers 61.

Referring to FIG. 6, the interface 62 can be observed in the even region 60*b*. Since a thickness D2 of the sidewall 60*a*-1 of the second uneven portion is formed to be relatively thin, the plurality of interfaces 62 may partially overlap at a portion 63 in the second uneven portion 60*a*. Consequently, as the number of interfaces 62 increases, the concentration of the p-type dopant may further increase in the sidewall 60*a*-1 of the second uneven portion.

Since holes have a relatively heavy effective mass, the hole implantation efficiency may be lowered when the thickness of the EBL 60 is not significantly thin. However, the second uneven portion 60*a* formed in the EBL 60 may have the thickness D2 that is relatively smaller than the thickness D1 of the even region 60*b*. In addition, since the second uneven portion 60*a* has low resistance due to a high concentration of the p-type dopant, hole implantation may be accelerated.

Referring to FIG. 1, the present embodiment may further include a trigger layer 40 disposed between the first semiconductor layer 30 and the active layer 50. An indium (In) content of the trigger layer 40 may be greater than that of the first semiconductor layer 30. Generally, indium (In) has a large lattice size. Consequently, in the case of a gallium nitride (GaN) layer containing a large amount of indium, an uneven portion may be easily formed thereon due to lattice non-conformity. As described above, according to the present embodiment, the first uneven portion 50*a* of the active layer 50 may also contribute to the emission of light, and thus a density and a size of the first uneven portion 50*a* may be intentionally increased.

Figure 7:
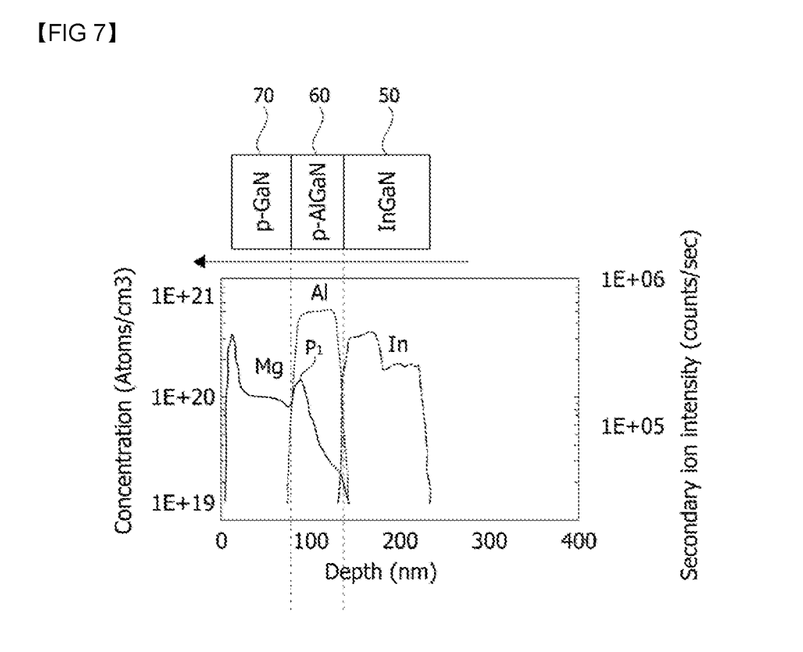
FIG. 7 is a diagram illustrating a result of analysis of a conventional light-emitting device by secondary ion mass spectroscopy (SIMS).
Figure 8:
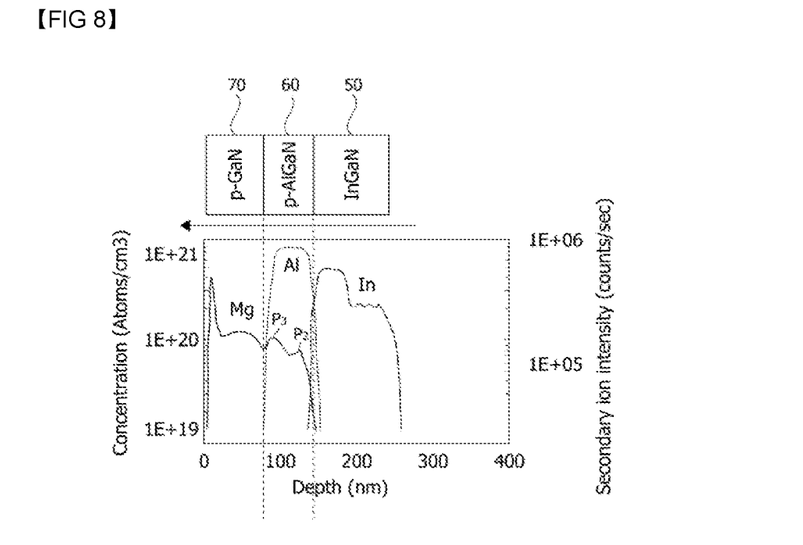
FIG. 8 is a diagram illustrating a result of analysis of the light-emitting device according to one embodiment of the present disclosure by SIMS.

FIG. 7 is a diagram illustrating a result of analysis of a conventional light-emitting device by secondary ion mass spectroscopy (SIMS), and FIG. 8 is a diagram illustrating an analysis result of the light-emitting device according to one embodiment of the present disclosure by a SIMS.

Referring to FIG. 7, as an EBL 60 according to a related art is grown without an interruption period and a thickness thereof is increased, a concentration of a p-type dopant increases. However, at an initial stage of growth, the p-type dopant is not doped well due to a memory effect. Consequently, the EBL 60 according to the related art has a single peak P1 of the p-type dopant concentration at a point at which the growth is finally completed.

Referring to FIG. 8, however, since at least one interruption period is provided during growth, the EBL 60 according to the present embodiment has a first peak P2 at an intermediate point of the thickness of the EBL 60 and has a second peak P3 at a point at which the growth is completed.

Consequently, a plurality of peak sections may be formed in the thickness direction of the EBL 60 by the interruption period being provided a plurality of times such that the concentration of the dopant may be increased.

Figure 9A:
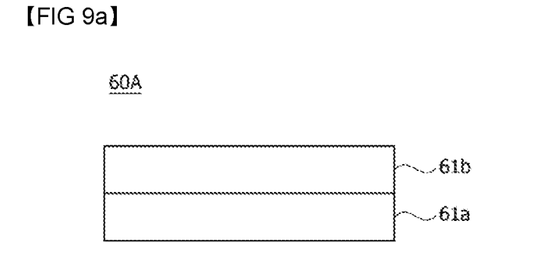
FIGS. 9A to 9C are diagrams for describing structures of various shapes of electron blocking layers.
Figure 9B:
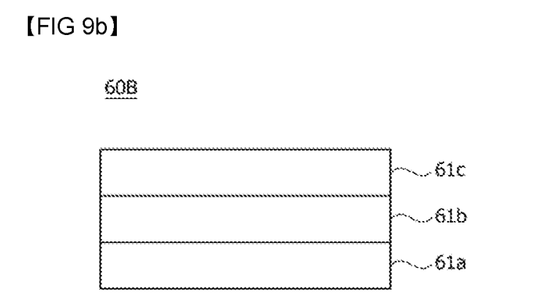
Figure 9C:
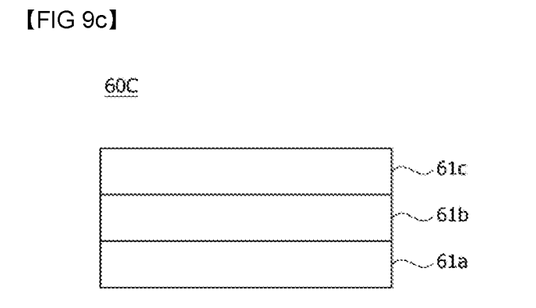

FIGS. 9A to 9C are diagrams for describing structures of various shapes of EBLs.

Referring to FIG. 9A, an EBL may include a first sub-layer 61*a* disposed adjacent to an active layer, and a second sub-layer 61*b* formed on the first sub-layer 61*a*. The first sub-layer 61*a* may promote doping of a p-type dopant by supplying indium (In) during the growth thereof.

Indium (In) has a relatively low bonding force due to a low melting point. Therefore, when indium first replaces Al and is then melted, a vacancy in which the p-type dopant may be doped may be formed. Consequently, a concentration of the p-type dopant may increase. The first sub-layer 61*a* may have at least two peak sections in a thickness direction of the first sub-layer 61*a*.

The second sub-layer 61*b* may be a layer identical to the first sub-layer 61*a* or may be a layer doped with the p-type dopant by a conventional method without an interruption period.

Referring to FIG. 9B, a first sub-layer 61*a* and a third sub-layer 61*c* may have a single peak section in a thickness direction thereof, and the second sub-layer 61*b* may have two or more peak sections in the thickness direction.

Each of the first sub-layer 61*a* and the third sub-layer 61*c* may be a layer doped with a p-type dopant through a conventional method without an interruption period, and a second sub-layer 61*b* may be a layer in which a plurality of peak sections are formed by an application of the interruption period to the growth thereof.

Referring to FIG. 9C, a first sub-layer 61*a* may be a layer undoped with a p-type dopant, and a second sub-layer 61*b* may be a layer in which a plurality of peak sections are formed by the application of an interruption period.

The first sub-layer 61*a* may be disposed closest to an active layer to serve as an insulating layer. Consequently, the first sub-layer 61*a* may act to effectively block electron movement.

When the p-type dopant is diffused into the active layer 50, a crystal defect may occur inside the active layer 50. Accordingly, the first sub-layer 61a undoped with the p-type dopant may also serve as a barrier that prevents the diffusion of the p-type dopant into the active layer when the second sub-layer 61b is formed. Each of the second sub-layer 61b and a third sub-layer 61c may be a layer in which a plurality of peak sections are formed by the application of the interruption period.

Figure 10:
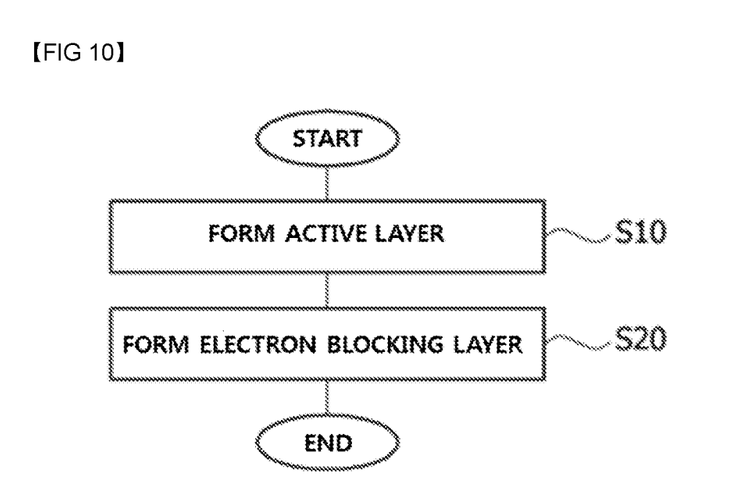
FIG. 10 is a flowchart of a method of manufacturing a light-emitting device according to one embodiment of the present disclosure.
Figure 11:
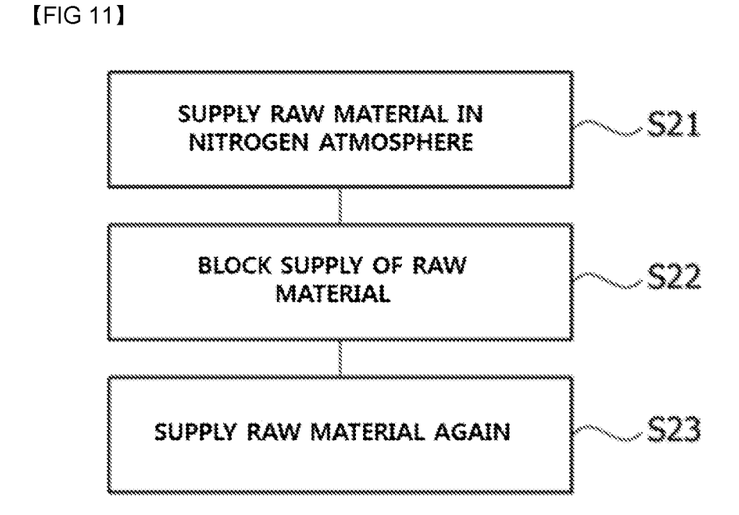
FIG. 11 is a detailed flowchart of a process of forming an electron blocking layer.

FIG. 10 is a flowchart of a method of manufacturing a light-emitting device according to one embodiment of the present disclosure, and FIG. 11 is a detailed flowchart of a process of forming an EBL.

Referring to FIGS. 1 and 10, the method of manufacturing a light-emitting device according to one embodiment of the present disclosure includes forming the active layer 50 in which the plurality of first uneven portions 50a are formed (S10), and forming the EBL 60 on the active layer 50 in which the plurality of first uneven portions 50a are formed to have the second uneven portion 60a (S20).

In the forming of the active layer 50 (S10), the first semiconductor layer 30 is formed on the support substrate 10, and then a barrier layer and a well layer are repeatedly formed on the first semiconductor layer 30. The first uneven portion 50a caused by the dislocation D may be formed in the active layer 50.

In the forming of the EBL (S20), a growth interruption period in which a supply of a raw material is interrupted a plurality of times for a predetermined period may be applied. Referring to FIG. 11, in the forming of the EBL, supplying the raw material in a nitrogen atmosphere (S21), stopping growth by blocking the supply of the raw material for a predetermined interruption period (S22), and supplying the raw material again (S23) may be repeated a plurality of times. At this point, the thickness D2 of the second uneven portion 60a may be grown to be smaller than the thickness D1 of the even region 60b.

Figure 12:
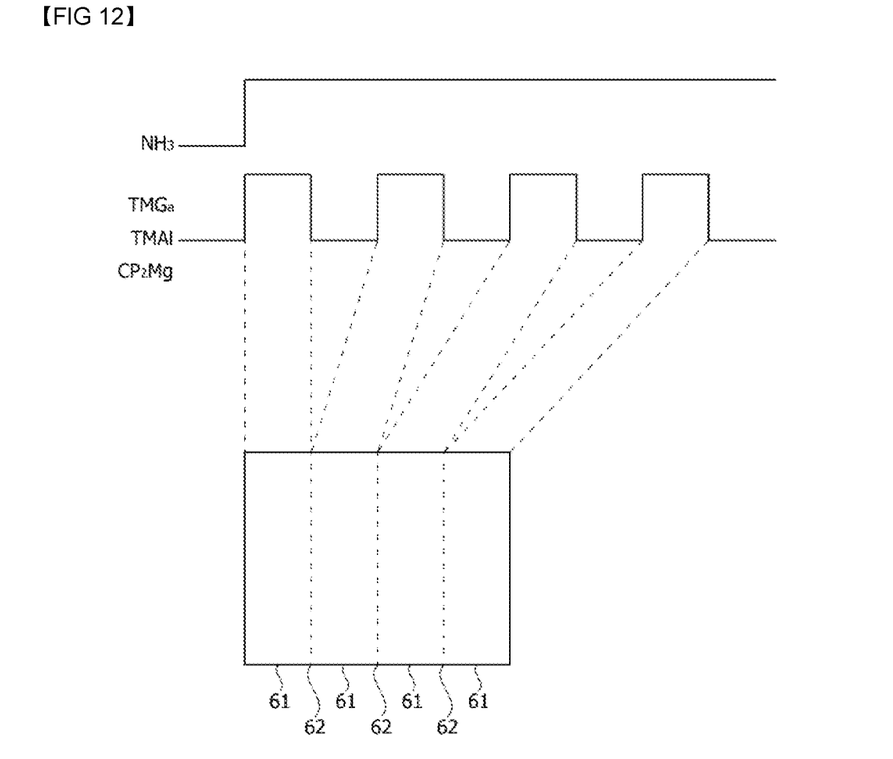
FIG. 12 is a timing diagram for describing a process of forming an interface between sub-layers by an interruption period.

Referring to FIG. 12, the EBL has a plurality of interfaces 62 according to the number of interruption periods. As described above, during the interruption period, a p-type dopant is bonded to the interface 62 to increase a doping concentration of the p-type dopant. At this point, trimethyl gallium (TMGa), trimethyl aluminum (TMAl), cyclopentadienyl magnesium ($CP_2Mg$), and ammonia ($NH_3$) are used as raw materials of Ga, Al, Mg, and N, but the raw materials are not limited thereto. At this point, the ammonia may be continuously supplied without applying the interruption period to maintain the nitrogen atmosphere.

Figure 13:
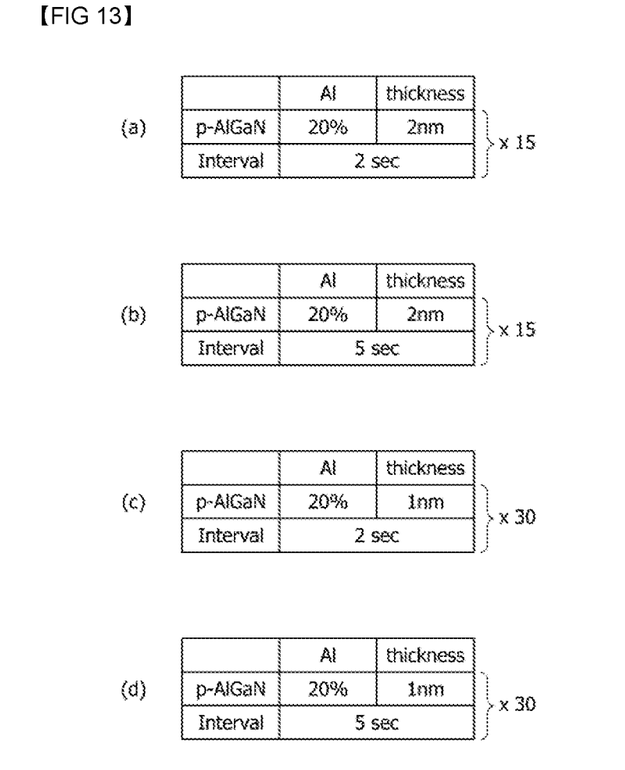
FIGS. 13 to 15 are diagrams for describing various shapes of electron blocking layers, in which an interruption period and thickness thereof are controlled.

Referring to FIG. 13, the forming of the EBL may be variously modified.

As shown in FIG. 13A, the interruption period (i.e., an interval) may be controlled to be 2 seconds such that a p-AlGaN layer having an Al composition of 20% may be formed as 15 layers, or, as shown in FIG. 13B, the interruption period may be controlled to be 5 seconds. Alternatively, as shown in FIGS. 13C and 13D, a thickness of the p-AlGaN layer may be controlled to be 1 nm to form a multilayer having 30 layers.

Figure 14:
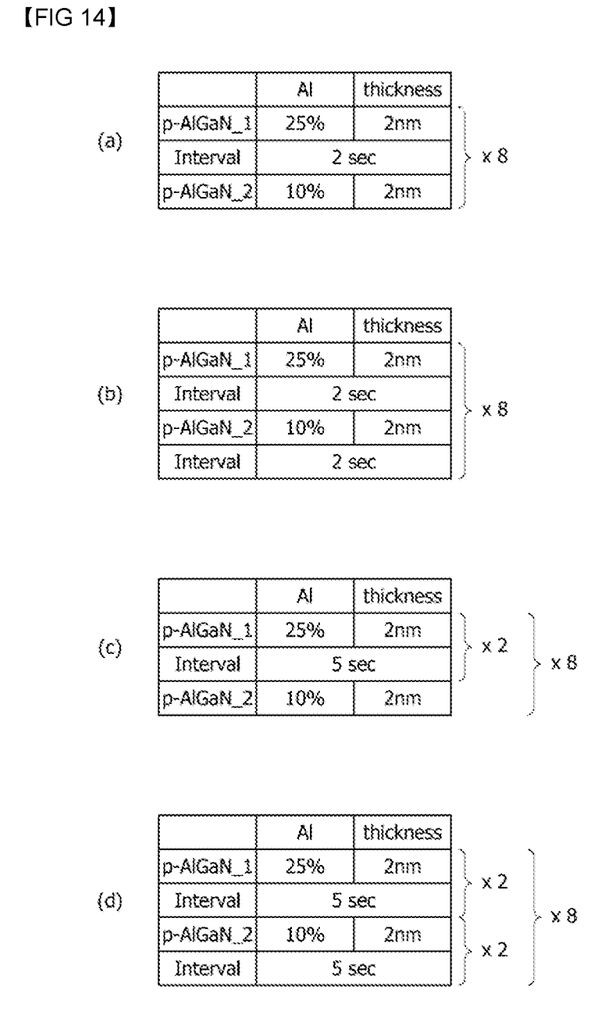
Figure 15:
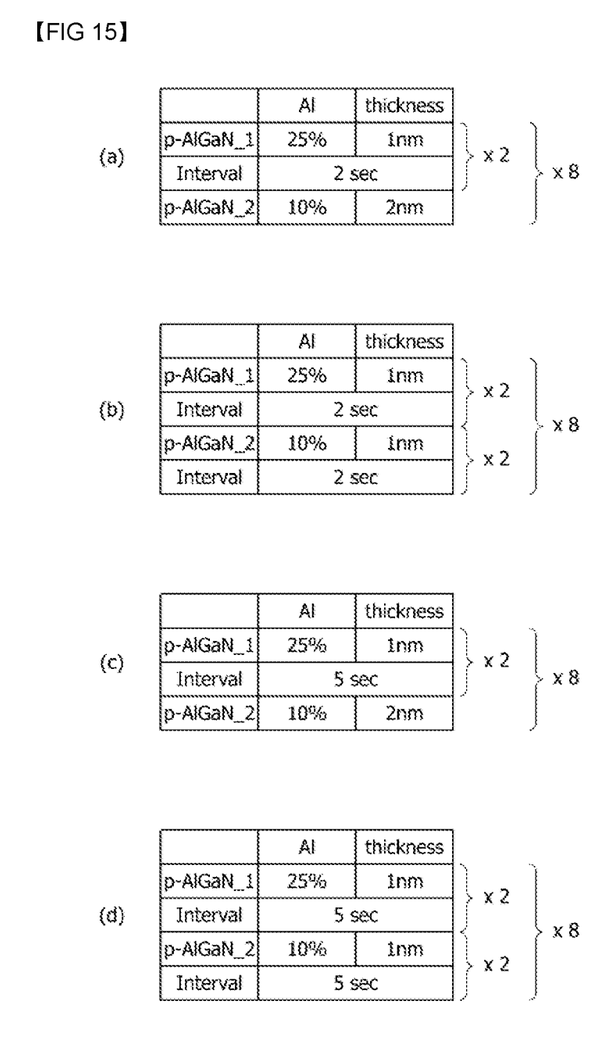

Referring to FIGS. 14 and 15, a plurality of p-AlGaN layers having different Al compositions may be formed.

Referring to FIG. 14A, a first p-AlGaN layer having an Al composition of 25% and a second p-AlGaN layer having an Al composition of 10% may be stacked to each have a thickness of 2 nm. At this point, an interruption period between the growth of the first p-AlGaN layer and the growth of the second p-AlGaN layer may be controlled to be 2 seconds. Thereafter, the above-described process may be repeated eight times.

Referring to FIG. 14B, interruption periods after a first p-AlGaN layer having an Al composition of 25% and a second p-AlGaN layer having an Al composition of 10% may each be controlled to be 2 seconds. Thereafter, the above-described process may be repeated eight times.

Referring to FIG. 14C, a first p-AlGaN layer having an Al composition of 25% and a second p-AlGaN layer having an Al composition of 10% may be stacked to each have a thickness of 2 nm. At this point, an interruption period between the growth of the first p-AlGaN layer and the growth of the second p-AlGaN layer may be controlled to be 5 seconds.

Referring to FIG. 14D, interruption periods after a first p-AlGaN layer having an Al composition of 25% and a second p-AlGaN layer having an Al composition of 10% may each be controlled to be 5 seconds.

Referring to FIG. 15A, a first p-AlGaN layer having an Al composition of 25% and a thickness of 1 nm and a second p-AlGaN layer having an Al composition of 10% and a thickness of 2 nm may be grown. At this point, the first p-AlGaN layer may be grown twice by controlling an interruption period to be 2 seconds, and then the second p-AlGaN layer may be grown. Thereafter, the above-described process may be repeated eight times.

Referring to FIG. 15B, a first p-AlGaN layer having an Al composition of 25% and a second p-AlGaN layer having an Al composition of 10% may be stacked to each have a thickness of 1 nm. At this point, the first p-AlGaN layer may be grown twice by controlling an interruption period to be 2 seconds, and then the second p-AlGaN layer may be grown twice, thereby completing the above-described process. Thereafter, the above-described process may be repeated eight times.

Referring to FIG. 15C, a first p-AlGaN layer having an Al composition of 25% and a thickness of 1 nm and a second p-AlGaN layer having an Al composition of 10% and a thickness of 2 nm may be grown. At this point, the first p-AlGaN layer may be grown twice by controlling an interruption period to be 2 seconds, and then the second p-AlGaN layer may be grown. Thereafter, the above-described process may be repeated eight times.

Referring to FIG. 15D, a first p-AlGaN layer having an Al composition of 25% and a second p-AlGaN layer having an Al composition of 10% may be stacked to each have a thickness of 1 nm. At this point, the first p-AlGaN layer may be grown twice by controlling an interruption period to be 5 seconds, and then the second p-AlGaN layer may be grown twice, thereby completing the above-described process. Thereafter, the above-described process may be repeated eight times.

The light-emitting device of the embodiment of the present disclosure may be configured to further include optical members such as a light guide plate, a prism sheet, a diffuser sheet, and the like, and may serve as a backlight unit. Further, the light-emitting device of the embodiment of the present disclosure may be further applied to a display device, a lighting device, and a pointing device.

At this point, the display device may include a bottom cover, a reflector, a light-emitting module, a light guide plate, an optical sheet, a display panel, an image signal output circuit, and a color filter. The bottom cover, the reflector, the light-emitting module, the light guide plate, and the optical sheet may configure a backlight unit.

The reflector is disposed on the bottom cover, and the light-emitting module emits light. The light guide plate is disposed in front of the reflector to guide the light emitted from the light-emitting module toward a front side, and the optical sheet includes a prism sheet and the like and is disposed in front of the light guide plate. The display panel is disposed in front of the optical sheet, the image signal output circuit supplies an image signal to the display panel, and the color filter is disposed in front of the display panel.

Further, the lighting apparatus may include a light source module including a substrate and the light-emitting device according to an embodiment of the present disclosure, a heat dissipation unit configured to dissipate heat of the light source module, and a power supplier configured to process or convert an electric signal provided from the outside and provide the electrical signal to the light source module. Further, the lighting device may include a lamp, a head lamp, a street lamp, or the like.

It should be understood that embodiments of the present disclosure are not limited to the above described embodiments and the accompanying drawings, and various substitutions, modifications, and alterations can be devised by those skilled in the art that without departing from the technical spirit of the embodiment described herein.

The invention claimed is:

1. A light-emitting device comprising:
a first semiconductor layer;
an active layer disposed on the first semiconductor layer and including a plurality of first uneven portions;
an electron blocking layer including a plurality of second uneven portions disposed on the plurality of first uneven portions; and
a second semiconductor layer formed on the electron blocking layer,
wherein the electron blocking layer has two or more doping concentration peak sections of a P-type dopant in a thickness direction of the electron blocking layer,
wherein each peak section is an inflection point at which a concentration of the p-type dopant increases and then decreases,
wherein the electron blocking layer further includes a plurality of sub-layers, and
wherein at least one of the peak sections is provided at an interface between two adjacent sub-layers.

2. The light-emitting device of claim 1, wherein a thickness of each of the plurality of second uneven portions is smaller than that of an even region formed between the plurality of second uneven portions.

3. The light-emitting device of claim 2, wherein the electron blocking layer has two or more peak sections in a thickness direction of the even region.

4. The light-emitting device of claim 1, wherein elements configuring the plurality of sub-layers are the same.

5. The light-emitting device of claim 1, wherein:
the electron blocking layer includes a first sub-layer closest to the active layer and a second sub-layer formed on the first sub-layer; and
the first sub-layer has two or more peak sections in the thickness direction.

6. The light-emitting device of claim 1, wherein:
the electron blocking layer includes a first sub-layer closest to the active layer and a second sub-layer formed on the first sub-layer;
the first sub-layer is undoped with the p-type dopant; and
the second sub-layer has two peak sections in the thickness direction.

7. The light-emitting device of claim 1, wherein the electron blocking layer includes a first carrier implantation path in a region provided between the plurality of second uneven portions, and a second carrier implantation path at a sidewall of each of the second uneven portions.

8. An electronic device comprising one or more light-emitting devices, wherein each of the light-emitting devices includes:
a first semiconductor layer;
an active layer disposed on the first semiconductor layer and including a plurality of first uneven portions;
an electron blocking layer including a plurality of second uneven portions disposed on the plurality of first uneven portions; and
a second semiconductor layer formed on the electron blocking layer,
wherein the electron blocking layer has two or more doping concentration peak sections of a P-type dopant in a thickness direction of the electron blocking layer,
wherein each peak section is an inflection point at which a concentration of the p-type dopant increases and then decreases,
wherein the electron blocking layer further includes a plurality of sub-layers, and
wherein at least one of the peak sections is provided at an interface between two adjacent sub-layers.

9. The electronic device of claim 8, wherein a thickness of each of the plurality of second uneven portions is smaller than that of an even region formed between the plurality of second uneven portions.

10. The electronic device of claim 9, wherein the electron blocking layer has two or more peak sections in a thickness direction of the even region.

11. The electronic device of claim 8, wherein the plurality of sub-layers have the same elements.

12. The electronic device of claim 8, wherein:
the electron blocking layer includes a first sub-layer closest to the active layer and a second sub-layer formed on the first sub-layer; and
the first sub-layer has two or more peak sections in the thickness direction.

13. The electronic device of claim 8, wherein:
the electron blocking layer includes a first sub-layer closest to the active layer and a second sub-layer formed on the first sub-layer;
the first sub-layer is undoped with the p-type dopant; and
the second sub-layer has two or more peak sections in the thickness direction.

14. The electronic device of claim 8, wherein the electron blocking layer includes a first carrier implantation path in a region provided between the plurality of second uneven portions, and a second carrier implantation path at a sidewall of each of the second uneven portions.

15. The electronic device of claim 8, wherein the electronic device is one of a display device, a lighting device, and a head lamp.

16. A light-emitting device comprising:
a first semiconductor layer;
an active layer disposed on the first semiconductor layer and including a plurality of first uneven portions;
an electron blocking layer including a plurality of second uneven portions disposed on the plurality of first uneven portions; and
a second semiconductor layer formed on the electron blocking layer, wherein the electron blocking layer has two or more doping concentration peak sections of a P-type dopant in a thickness direction of the electron blocking layer,
wherein each peak section is an inflection point at which a concentration of the p-type dopant increases and then decreases,
wherein the electron blocking layer further includes a plurality of sub-layers,
wherein at least one of the peak sections is provided at an interface between two adjacent sub-layers,
wherein a thickness of each of the plurality of second uneven portions is smaller than that of an even region formed between the plurality of second uneven portions,
wherein the electron blocking layer has two or more peak sections in a thickness direction of the even region,
wherein elements configuring the plurality of sub-layers are the same,
wherein the electron blocking layer includes a first sub-layer closest to the active layer and a second sub-layer formed on the first sub-layer; and the first sub-layer has two or more peak sections in the thickness direction, and
wherein the electron blocking layer includes a first carrier implantation path in a region provided between the plurality of second uneven portions, and a second carrier implantation path at a sidewall of each of the second uneven portions.

* * * * *